United States Patent
Baba et al.

(10) Patent No.: US 12,426,330 B2
(45) Date of Patent: Sep. 23, 2025

(54) SEMICONDUCTOR DEVICE

(71) Applicant: FUJI ELECTRIC CO., LTD., Kawasaki (JP)

(72) Inventors: Masakazu Baba, Matsumoto (JP); Shinsuke Harada, Tsukuba (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 436 days.

(21) Appl. No.: 18/158,184

(22) Filed: Jan. 23, 2023

(65) Prior Publication Data

US 2023/0246075 A1  Aug. 3, 2023

(30) Foreign Application Priority Data

Jan. 31, 2022 (JP) ................. 2022-012509

(51) Int. Cl.
  *H10D 62/83* (2025.01)
  *H10D 30/66* (2025.01)
  (Continued)

(52) U.S. Cl.
  CPC ....... *H10D 62/8325* (2025.01); *H10D 30/668* (2025.01); *H10D 84/146* (2025.01)

(58) Field of Classification Search
  CPC ............. H10D 62/8325; H10D 30/668; H10D 84/146; H10D 30/665; H10D 12/481; H10D 12/031; H10D 62/8503; H10D 62/127; H10D 62/107; H10D 62/405; H10D 8/60–605; H10D 8/051; H10D 8/045; H10D 8/50; H10D 8/411; H10D 8/422; H10D 8/00–825; H10D 8/041; H10D 64/01; H10D 64/64; H10D 62/126;
  (Continued)

(56) References Cited

U.S. PATENT DOCUMENTS

| | | | |
|---|---|---|---|
| 5,614,749 A | 3/1997 | Ueno | |
| 2012/0080728 A1 | 4/2012 | Malhan | |
| 2020/0294989 A1* | 9/2020 | Okumura | ............... H10D 89/60 |

FOREIGN PATENT DOCUMENTS

| | | |
|---|---|---|
| JP | H08204179 A | 8/1996 |
| JP | 2012079795 A | 4/2012 |

* cited by examiner

*Primary Examiner* — Moin M Rahman
(74) *Attorney, Agent, or Firm* — Rabin & Berdo. P.C.

(57) ABSTRACT

A semiconductor device having a connecting region between an active region and an edge region. The semiconductor device including a semiconductor substrate, a first semiconductor layer provided on the semiconductor substrate, a second semiconductor layer provided on the first semiconductor layer, a plurality of first semiconductor regions selectively provided in the second semiconductor layer, a plurality of first and second trenches penetrating through the first semiconductor regions and the second semiconductor layer, a plurality of gate electrodes provided in the first trenches, via a plurality of gate insulating films, respectively, and a plurality of Schottky electrodes respectively provided in the second trenches. The semiconductor substrate, the first and second semiconductor layers, the first semiconductor regions, the first trenches, the gate electrodes and the gate insulating films are provided in the active region. The second trenches and the Schottky electrodes are provided in both the active region and the connecting region.

5 Claims, 13 Drawing Sheets

(51) Int. Cl.
*H10D 62/832* (2025.01)
*H10D 84/00* (2025.01)

(58) Field of Classification Search
CPC .... H10D 62/60; H10D 62/106; H10D 62/102; H10D 62/124
See application file for complete search history.

SEMICONDUCTOR DEVICE

CROSS REFERENCE TO RELATED APPLICATIONS

This application is based upon and claims the benefit of priority of the prior Japanese Patent Application No. 2022-012509, filed on Jan. 31, 2022, the entire contents of which are incorporated herein by reference.

BACKGROUND OF THE INVENTION

1. Field of the Invention

Embodiments of the invention relate to a semiconductor device.

2. Description of the Related Art

Conventionally, to reduce the ON resistance of an element in a power semiconductor device, a vertical metal oxide semiconductor field effect transistor (MOSFET) having a trench structure is fabricated (manufactured). In the vertical MOSFET, the trench structure in which a channel is formed orthogonal to a substrate surface enables the cell density per unit area to be increased more easily as compared to a planar structure in which the channel is formed parallel to the substrate surface. Therefore, with the trench structure, the cell density per unit area may be increased more than with a planar structure and in terms of cost, this is advantageous.

The vertical MOSFET has, as a body diode between a source and drain, a built-in parasitic pn diode formed by a p-type base layer and an n-type drift layer. Thus, a freewheeling diode (FWD) used in an inverter may be omitted, thereby contributing to reductions in cost and size. Nonetheless, when a silicon carbide substrate is used as a semiconductor substrate, built-in potential of the parasitic pn diode is high as compared to an instance in which a silicon (Si)substrate is used and thus, on-resistance of the parasitic pn diode increases, inviting increases in loss. Further, changes in characteristics over time (degradation over time), forward degradation, and increases in turn-on loss occur due to the bipolar operation of the parasitic pn diode when the parasitic pn diode turns on and conducts.

To address this problem, a Schottky barrier diode (SBD) is connected in parallel to a MOSFET on a circuit, thereby enabling a configuration in which current flows to the SBD and not to the parasitic pn diode during reflux. Nonetheless, the number of SBD chips necessary is about the same as that of the MOSFET and thus, cost increases.

Therefore, a technique has been proposed in which at the substrate surface, a contact trench that penetrates through a p-type channel portion is formed and a SBD is included at a trench inner wall, whereby current flows through the built-in SBD and not a PiN diode during reflux (for example, refer to Japanese Laid-Open Patent Publication No. H8-204179).

FIG. 16 is a top view of a structure of a conventional silicon carbide semiconductor device with a built-in SBD. FIG. 17 is a cross-sectional view of a portion of the conventional silicon carbide semiconductor device, along cutting line C-C' in FIG. 16. FIG. 18 is a cross-sectional view of a portion of the conventional silicon carbide semiconductor device, along cutting line B-B' in FIG. 16. As depicted in FIG. 16, a silicon carbide semiconductor device 150 with a built-in SBD has an active region 140 through which current flows during an on-state and in which a device structure is formed, an edge region 142 that surrounds a periphery of the active region 140 and sustains a breakdown voltage, and a connecting region 141 that is between the active region 140 and the edge region 142. The active region 140 is a region surrounded by a black line in FIG. 16.

As depicted in FIG. 16, in the active region 140, trench gates 131 each having a shape of a stripe and trench SBDs 132 each having a shape of a stripe are provided so at to alternate one another. In the connecting region 141, a gate contact 143 that electrically connects the trench gates 131 and a gate electrode pad 145 is provided so as to surround the active region 140. Further, the trench gates 131 and the gate contact 143 are electrically connected to each other by a polysilicon 144 provided in the connecting region 141.

Further, as depicted in FIG. 17, the silicon carbide semiconductor device 150 with a built-in SBD has MOS gates of a general trench gate structure in a front side (side having a later-described p-type base layer 116) of a semiconductor wafer (hereinafter, silicon carbide wafer) thereof containing silicon carbide. The silicon carbide wafer (semiconductor chip) is formed by sequentially forming by epitaxial growth on an $n^+$-type starting substrate (hereinafter, $n^+$-type silicon carbide substrate) 102 containing silicon carbide, silicon carbide layers that constitute an $n^-$-type drift layer 101, an n-type region 115 that is a current spreading region, and the p-type base layer 116.

On the $n^+$-type silicon carbide substrate 102, an $n^-$-type layer constituting the $n^-$-type drift layer 101 is epitaxially grown, and in a front side (side having the $n^-$-type drift layer 101) of the $n^+$-type silicon carbide substrate 102, a MOS gate structure constituted by the p-type base layer 116, $n^+$-type source regions 117, the trench gates 131, gate insulating films 119, and gate electrodes 120 is provided. Further, reference numerals 118, 121, and 122 are a $p^{++}$-type contact region, an interlayer insulating film, and a source electrode.

In the n-type region 115, first $p^+$-type regions 103 are selectively provided so as to underlie entire bottoms of the trench gates 131. Further, in the n-type region 115, the first $p^+$-type regions 103 are selectively provided so as to underlie entire bottoms of the trench SBDs 132. The first $p^+$-type regions 103 are provided at a depth not reaching the $n^-$-type drift layer 101. Further, as depicted in FIG. 18, in the edge region 142, a second $p^+$-type region 104 is provided on an entire area of surfaces of the first $p^+$-type regions 103.

Further, the trench SBDs 132 are trenches in which the inner walls thereof are covered by Schottky metals 126 that are connected to the source electrode 122 and in which Schottky contacts are formed between semiconductor regions exposed at the inner walls and the Schottky metals 126. In this manner, in FIG. 17, a parasitic Schottky diode (built-in SBD) connected in parallel to a parasitic pn diode is provided between the source and drain.

In the MOSFET on a single semiconductor substrate in which a SBD is built into, the built-in SBD has forward voltage that is lower than that of a parasitic diode (body diode) formed by a pn junction with a base region of the MOSFET, the built-in SBD preferentially operates during a switching operation of the MOSFET. Thus, reverse recovery loss of the parasitic diode decreases.

When voltage is applied to the source electrode 122 and negative voltage is applied to a drain electrode (not depicted) provided at a back surface of the $n^+$-type silicon carbide substrate 102 (when the MOSFET is off), a pn junction between the p-type base layer 116 and the $n^-$-type drift layer 101 is forward biased. In FIG. 17, the parasitic Schottky diode is provided so as to turn on when the MOSFET is off before the parasitic pn diode turns on, whereby bipolar operation of the parasitic pn diode is suppressed and degradation over time due to bipolar operation may be prevented.

Further, a known semiconductor device has, in an outer peripheral breakdown region, a Schottky diode that has a trench and a Schottky electrode that is provided in the trench and electrically connected to a drift layer (for example, refer to Japanese Laid-Open Patent Publication No. 2012-79795).

SUMMARY OF THE INVENTION

According to an embodiment of the present invention, a semiconductor device having an active region through which current flows in an on state of the semiconductor device, an edge region surrounding a periphery of the active region in a top view of the semiconductor device, and sustaining a breakdown voltage, and a connecting region that is between the active region and the edge region, includes: a semiconductor substrate of a first conductivity type, the semiconductor substrate having a main surface; a first semiconductor layer of the first conductivity type, provided on the main surface of the semiconductor substrate, the first semiconductor layer having an impurity concentration that is lower than an impurity concentration of the semiconductor substrate, the first semiconductor layer having a first surface and a second surface that are opposite to each other, the second surface facing the semiconductor substrate; a second semiconductor layer of a second conductivity type, provided on the first surface of first semiconductor layer; a plurality of first semiconductor regions of the first conductivity type, selectively provided in the second semiconductor layer and having an impurity concentration that is higher than the impurity concentration of the semiconductor substrate; a plurality of first trenches and a plurality of second trenches that penetrate through the plurality of first semiconductor regions and the second semiconductor layer and reach the first semiconductor layer; a plurality of gate electrodes provided in the plurality of first trenches, via a plurality of gate insulating films, respectively; and a plurality of Schottky electrodes provided in the plurality of second trenches, respectively. The semiconductor substrate, the first semiconductor layer, the second semiconductor layer, the plurality of first semiconductor regions, the plurality of first trenches, the plurality of gate electrodes, and the plurality of gate insulating films are provided in the active region. The plurality of second trenches and the plurality of Schottky electrodes are provided in both the active region and the connecting region.

Objects, features, and advantages of the present invention are specifically set forth in or will become apparent from the following detailed description of the invention when read in conjunction with the accompanying drawings.

BRIEF DESCRIPTION OF THE DRAWINGS

" in FIG. 1 depicting the structure of the silicon carbide semiconductor device according to the first embodiment.

" in FIG. 1 depicting the structure of the silicon carbide semiconductor device according to the first embodiment.

" in FIG. 1 depicting the structure of the silicon carbide semiconductor device according to the first embodiment.

" in FIG. 1 depicting the structure of the silicon carbide semiconductor device according to the first embodiment.

" in FIG. 1 depicting the structure of the silicon carbide semiconductor device according to the first embodiment.

DETAILED DESCRIPTION OF THE INVENTION

Figure 18:
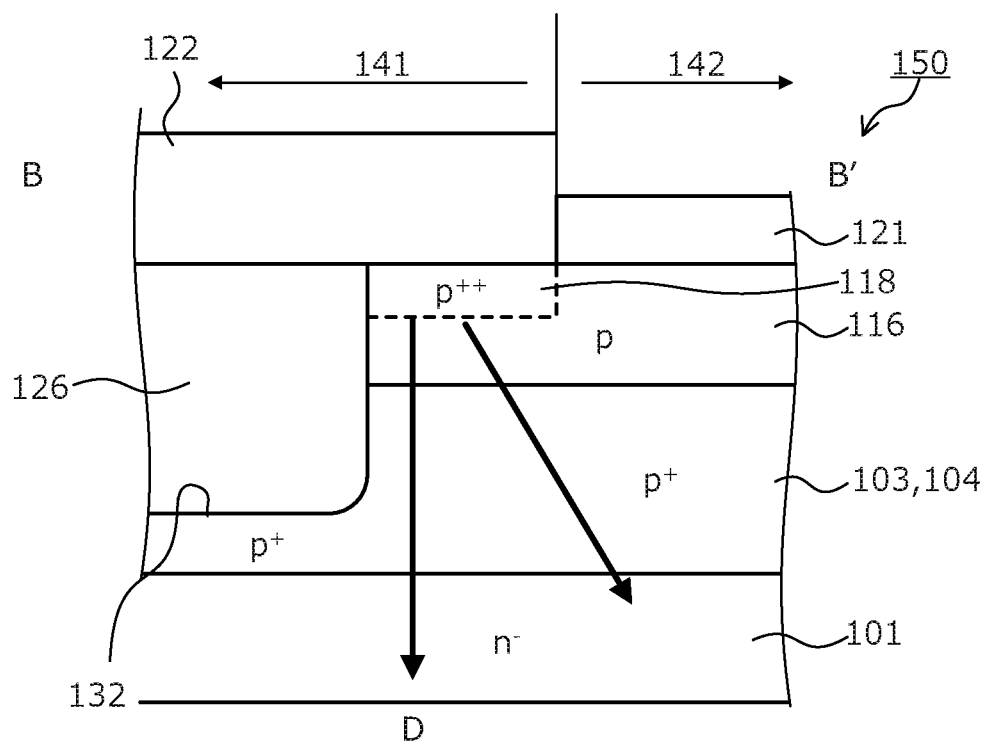
FIG. 18 is a cross-sectional view of a portion of the conventional silicon carbide semiconductor device, along cutting line B-B' in FIG. 16.

First, problems associated with the conventional techniques are discussed. As depicted in FIG. 18, in the connecting region 141, the second $p^+$-type region 104 is provided on the first $p^+$-type regions 103. Further, in the p-type base layer 116, at the surface thereof, the $p^{++}$-type contact region 118 is provided in contact with the trench SBDs 132. Thus, in the connecting region 141, the structure is such that peripheries of the trench SBDs 132 are surrounded by p-type regions (the p-type base layer 116, the $p^{++}$-type contact region 118, the first $p^+$-type regions 103, and the second $p^+$-type region 104).

In the connecting region 141, reverse recovery loss due to the parasitic pn diode occurs. As a result, in the connecting region 141, the trench SBDs 132 do not function as parasitic Schottky diodes and thus, bipolar operation of the parasitic pn diodes cannot be suppressed. When the parasitic pn diode turns on and conducts, hole current flows as depicted by path D in FIG. 18 due to the bipolar operation of the parasitic pn diode, and stacking faults are generated and expand due to energy generated by recombination by the hole current and electron current.

Therefore, a problem arises in that, as compared to in the active region 140, characteristics of the connecting region 141 change (degrade) to a greater extent over time due to the bipolar operation of the parasitic pn diode.

Embodiments of a semiconductor device according to the present invention are described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, main portions that are identical will be given the same reference numerals and will not be repeatedly described. Further, in the present description, when Miller indices are described, "−" means a bar added to an index immediately after the "−", and a negative index is expressed by prefixing "−" to the index. Further, with consideration of variation in manufacturing, description indicating the same or equal may be within 5%.

Figure 1:
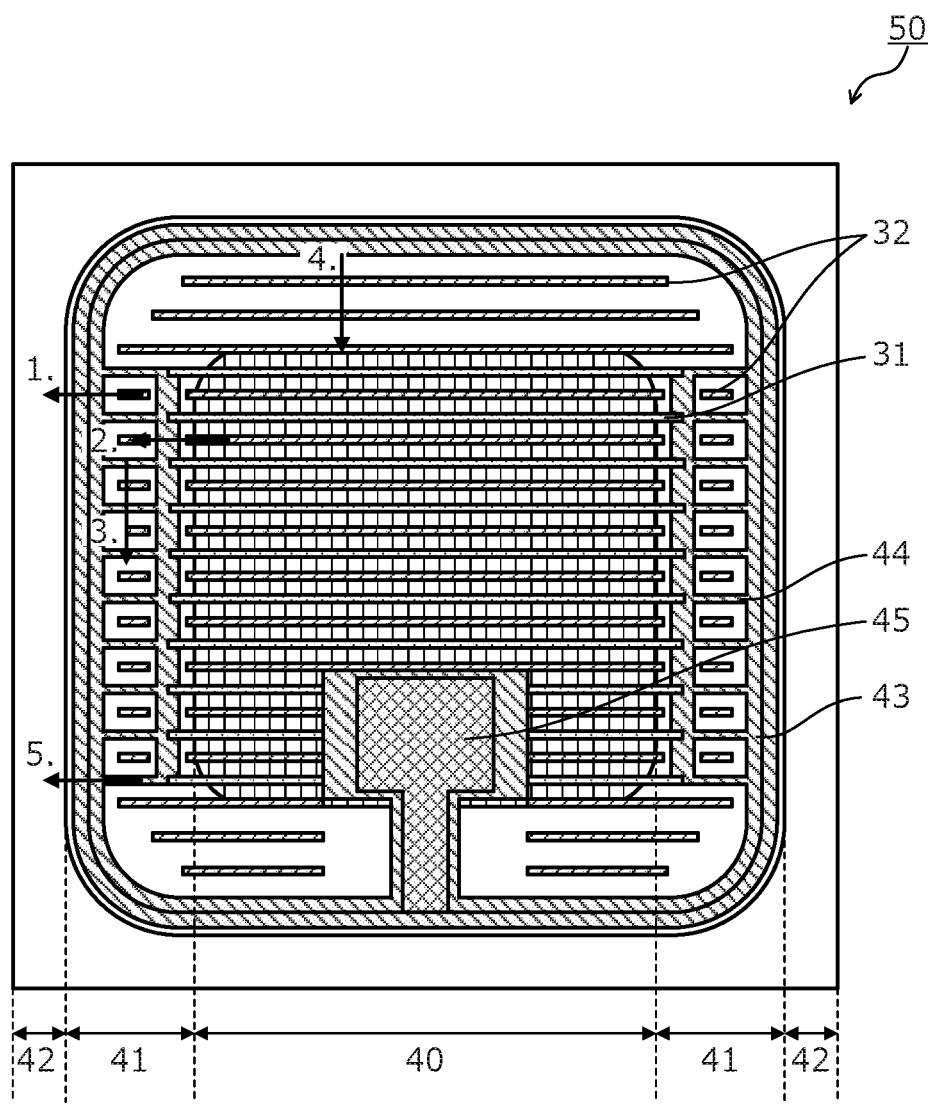
FIG. 1 is a top view of a structure of a silicon carbide semiconductor device according to a first embodiment.
Figure 2:
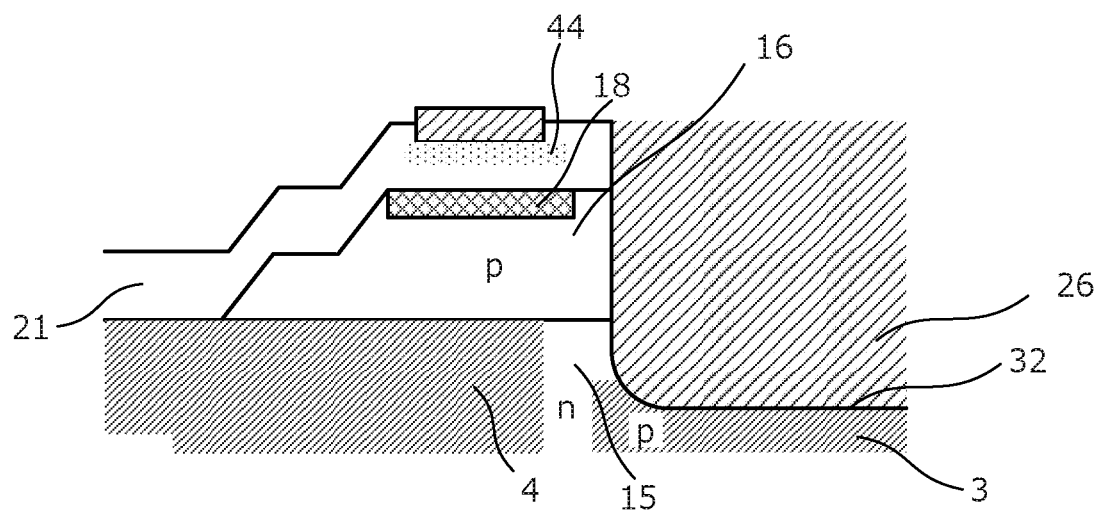
FIG. 2 is a cross-sectional view of a portion indicated by "1.
Figure 3:
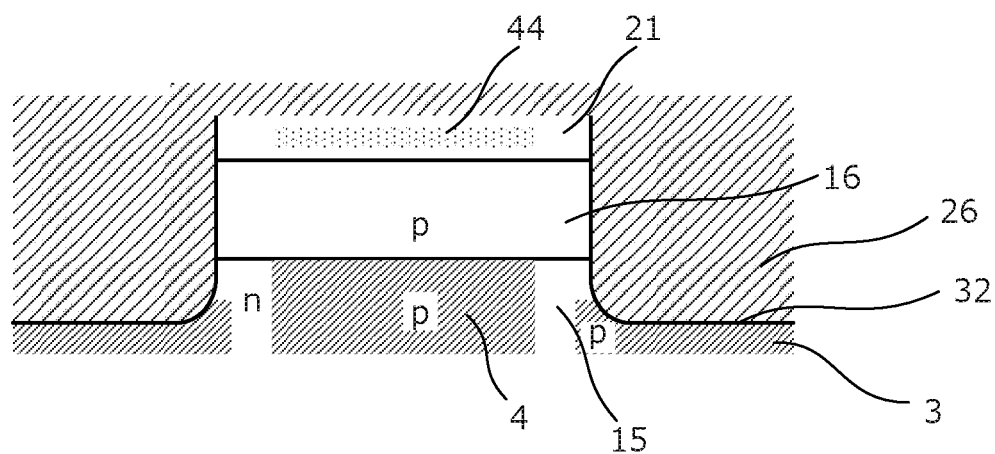
FIG. 3 is a cross-sectional view of a portion indicated by "2.
Figure 4:
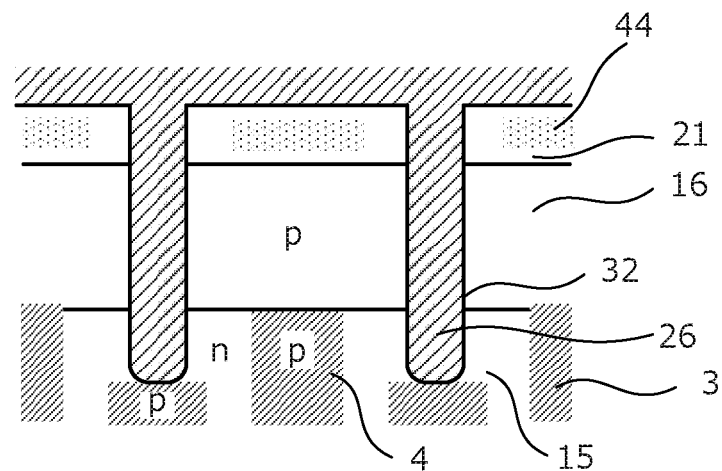
FIG. 4 is a cross-sectional view of a portion indicated by "3.
Figure 5:
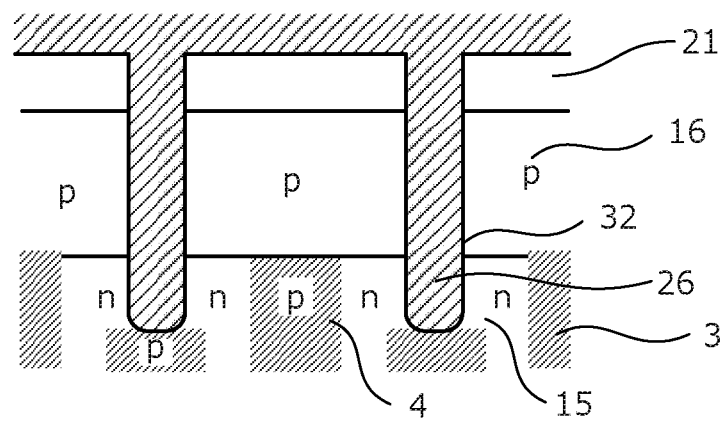
FIG. 5 is a cross-sectional view of a portion indicated by "4.
Figure 6:
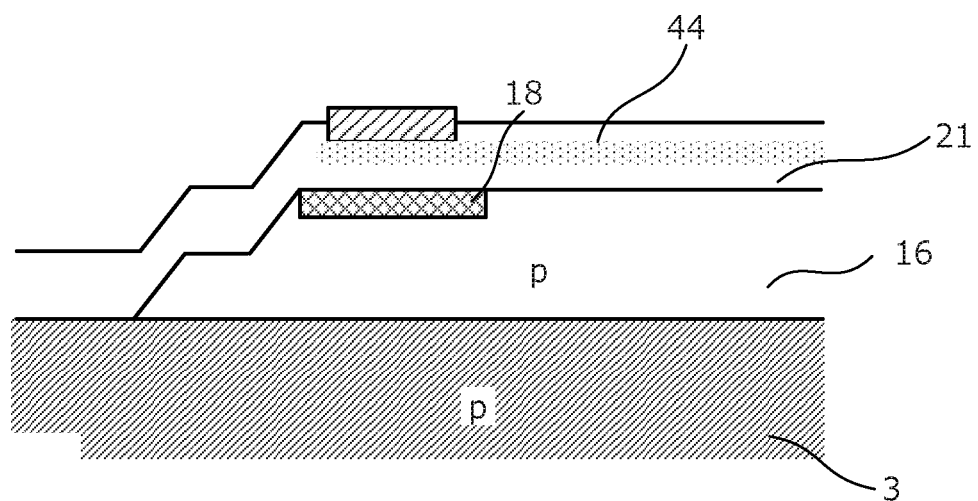
FIG. 6 is a cross-sectional view of a portion indicated by "5.

A semiconductor device according to the present invention contains a semiconductor having a band gap that is wider than that of silicon (hereinafter, wide band gap semiconductor. Here, a structure of a semiconductor device (silicon carbide semiconductor device) that contains, for example, silicon carbide (SiC) as a wide band gap semiconductor is described as an example. FIG. 1 is a top view of the structure of the silicon carbide semiconductor device according to the first embodiment. FIG. 2 is a cross-sectional view of a portion indicated by "1." in FIG. 1 depicting the structure of the silicon carbide semiconductor device according to the first embodiment. FIG. 3 is a cross-sectional view of a portion indicated by "2." in FIG. 1 depicting the structure of the silicon carbide semiconductor device according to the first embodiment. FIG. 4 is a cross-sectional view of a portion indicated by "3." in FIG. 1 depicting the structure of the silicon carbide semiconductor device according to the first embodiment. FIG. 5 is a cross-sectional view of a portion indicated by "4." in FIG. 1 depicting the structure of the silicon carbide semiconductor device according to the first embodiment. FIG. 6 is a cross-sectional view of a portion indicated by "5." in FIG. 1 depicting the structure of the silicon carbide semiconductor device according to the first embodiment. A cross-sectional view of the active region of the silicon carbide semiconductor device according to the first embodiment is the same as that of the conventional silicon carbide semiconductor device having a built-in SDB and therefore, not depicted.

As depicted in FIG. 1, a silicon carbide semiconductor device 50 having a built-in SBD is configured by an active region 40 in which a device structure is formed and through which a main current flows in a direction of thickness of the substrate during an on-state, an edge region 42 that surrounds a periphery of the active region 40 and sustains a breakdown voltage, and a connecting region 41 that is between the active region 40 and the edge region 42. The active region 40 is a region surrounded by a black line in FIG. 1. The connecting region 41, as depicted in FIG. 2, is a region that does not function as a MOS and in which side surfaces of later-described trench gates 31 are covered by p-type regions. FIGS. 4 and 5 depict only one unit cell (functional unit of the device) and other unit cells adjacent thereto are not depicted. The silicon carbide semiconductor device according to the present embodiment depicted in FIGS. 1 to 6 is a MOSFET that has MOS gates in a front side (side having a later-described p-type base layer 16) of a semiconductor wafer (silicon carbide wafer: semiconductor chip) that contains silicon carbide.

The silicon carbide wafer is formed by sequentially forming, by epitaxial growth on an $n^+$-type starting substrate (semiconductor substrate of a first conductivity type) 2 that contains silicon carbide, silicon carbide layers that constitute an $n^-$-type drift layer (first semiconductor layer of the first conductivity type) 1 and the p-type base layer (second semiconductor layer of a second conductivity type) 16. In the active region 40, the MOS gates are configured by the p-type base layer 16, $n^+$-type source regions (first semiconductor regions of the first conductivity type) 17, gate insulating films 19, and gate electrodes 20. In particular, in the $n^-$-type drift layer 1, at the surface thereof facing a source (surface facing a later-described source electrode 22), an n-type region 15 may be provided so as to be in contact with the p-type base layer 16. The n-type region 15 is a so-called current spreading layer (CSL) that reduces carrier spreading resistance. The n-type region 15, for example, is provided uniformly in a direction parallel to a wafer front surface (the front surface of the silicon carbide wafer).

In the n-type region 15 (in an instance in which the n-type region 15 is omitted, the $n^-$-type drift layer 1, hereinafter, indicated as "(1)"), first $p^+$-type regions 3 are selectively provided. In the active region 40, the first $p^+$-type regions 3 are provided so as to be in contact with bottoms of later-described trench gates (first trenches) 31 and bottoms of later-described trench SBDs (second trenches) 32. Further, in the n-type region 15 (1), at the surface thereof, second $p^+$-type regions 4 are selectively provided. The second $p^+$-type regions 4 are provided so that bottoms thereof are in contact with the first $p^+$-type regions 3.

In an instance in which the n-type region 15 is provided, the first $p^+$-type regions 3 are each provided from a position closer to a drain than is an interface between the p-type base layer 16 and the n-type region 15, at a depth not reaching an interface between the n-type region 15 and the $n^-$-type drift layer 1. The first $p^+$-type regions 3 are provided, whereby near the bottoms of the trench gates 31, the trench SBDs 32, pn junctions between the first $p^+$-type regions 3 and the n-type region 15 (1) may be formed. The first $p^+$-type regions 3 and the second $p^+$-type regions 4 have impurity concentrations that are higher than an impurity concentration of the p-type base layer 16.

Further, in the p-type base layer 16, the $n^+$-type source regions (first semiconductor regions of the first conductivity type) 17 are selectively provided. The $n^+$-type source regions 17 and $p^{++}$-type contact regions 18 may each be selectively provided so as to be in contact with one another. In this instance, a depth of the $p^{++}$-type contact regions 18, for example, may be a same as a depth of the $n^+$-type source regions 17 or may be deeper than the depth of the $n^+$-type source regions 17.

As depicted in FIG. 1, the trench SBDs 32 and the trench gates 31 are provided in a striped patterned in a direction that is a crystal direction <11-20> of the $n^+$-type silicon carbide substrate 2. The trench gates 31 penetrate through the $n^+$-type source regions 17 and the p-type base layer 16 from the wafer front surface and reach the n-type region 15 (1). In the trench gates 31, the gate insulating films 19 are provided along sidewalls of the trench gates 31, and the gate electrodes 20 are provided on the gate insulating films 19. Each of the gate electrodes 20 may have an end that faces the source and protrudes outward from the wafer front surface. The gate electrodes 20 are electrically connected to a gate electrode pad 45. An interlayer insulating film 21 is provided in an entire area of the wafer front surface so as to cover the gate electrodes 20 embedded in the trench gates 31. Further, to prevent the trench gates 31 from functioning as a MOS in the connecting region 41, the sidewalls and bottoms of the trench gates 31 are in contact with the first and second $p^+$-type regions 3, 4.

The trench SBDs 32 penetrate through the $n^+$-type source regions 17 and the p-type base layer 16 from the wafer front surface and reach the n-type region 15 (1). In the trench SBDs 32, Schottky metals 26 connected to the source electrode 22 are provided along and cover the sidewalls of the trench SBDs 32, and Schottky junctions between semiconductor regions exposed at the inner walls and the Schottky metals 26 are formed. Further, on the Schottky metals 26, oxide films, for example, silicon dioxide ($SiO_2$), may be provided.

In the connecting region 41, a gate contact 43 that electrically connects the trench gates 31 and the gate electrode pad 45 is provided so as to surround the active region 40. Further, the trench gates 31 and the gate contact 43 are electrically connected by a polysilicon 44 provided in the connecting region 41.

Here, as depicted in FIG. 1, the trench SBDs 32 are further disposed in the connecting region 41 at a same cell pitch as that in the active region 40. Thus, in this manner, similarly to the active region 40, in the connecting region 41 as well, an effect of suppressing parasitic pn diode operation by the trench SBDs 32 is obtained. Therefore, in the first embodiment, degradation of characteristics in the chip overall due to forward conduction may be suppressed. Further, an interval between the trench SBDs 32 disposed in the connecting region 41 may be equal to that between the trench SBDs 32 disposed in the active region 40 or may be wider.

Further, a polysilicon 34 is wired between the trench SBDs 32 disposed in the connecting region 41, and the trench gates 31 are electrically connected to the gate contact 43 of the edge region 42. Wiring of the polysilicon 34 is disposed so as to extend linearly from an end of the silicon carbide semiconductor device 50 having the built-in SBDs, to the gate contact 43. In this manner, increases in gate resistance may be prevented by not complicating a path from the ends of the trench SBDs 32 of the silicon carbide semiconductor device 50 having the built-in SBDs, to the gate contact 43.

Further, as depicted in FIGS. 4 and 5, in the connecting region 41 as well, to suppress decreases in breakdown voltage, a layout of a JFET width (width between the first $p^+$-type regions 3 that are adjacent to one another), the first $p^+$-type regions 3, and the second $p^+$-type regions 4 at the bottoms of the trench SBDs 32 is assumed to be the same as that in the active region 40.

Figure 7:
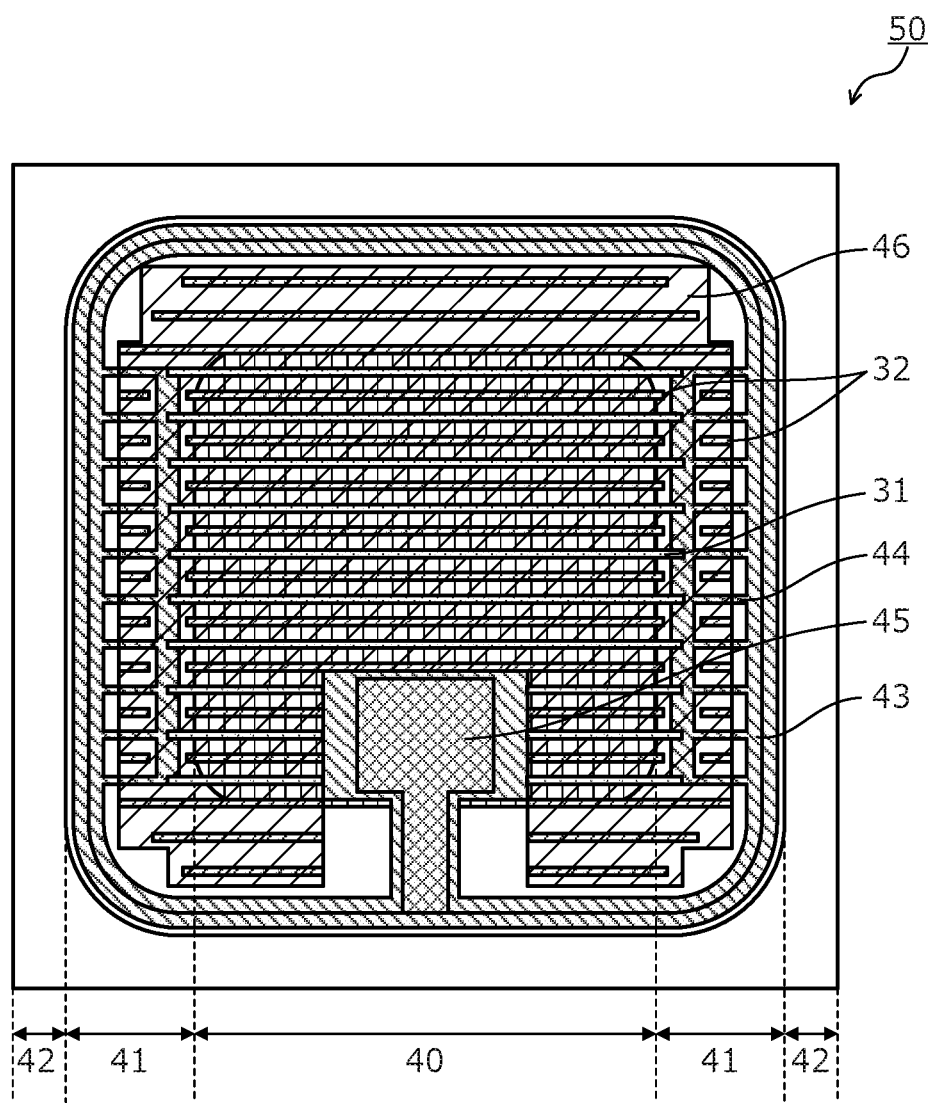
FIG. 7 is a top view depicting a source electrode pad of the silicon carbide semiconductor device according to the first embodiment.

The source electrode 22 is in contact with the $n^+$-type source regions 17 via contact holes opened in the interlayer insulating film 21 and is electrically insulated from the gate electrodes 20 by the interlayer insulating film 21. In an instance in which the $p^{++}$-type contact regions 18 are provided, the source electrode 22 is also in contact with the $p^{++}$-type contact regions 18. Between the source electrode 22 and the interlayer insulating film 21, for example, a barrier metal that prevents diffusion of metal atoms from the source electrode 22 to the gate electrodes 20 may be provided. On the source electrode 22, a source electrode pad 46 is provided. FIG. 7 is a top view depicting the source electrode pad of the silicon carbide semiconductor device according to the first embodiment. As depicted in FIG. 7, the source electrode pad 46 is provided on the active region 40 and the connecting region 41 in which the trench SBDs 32 are disposed. The drain electrode (not depicted) is provided on the back surface (back surface of the $n^+$-type silicon carbide substrate 2 constituting the $n^+$-type drain region) of the silicon carbide semiconductor device 50.

Figure 8:
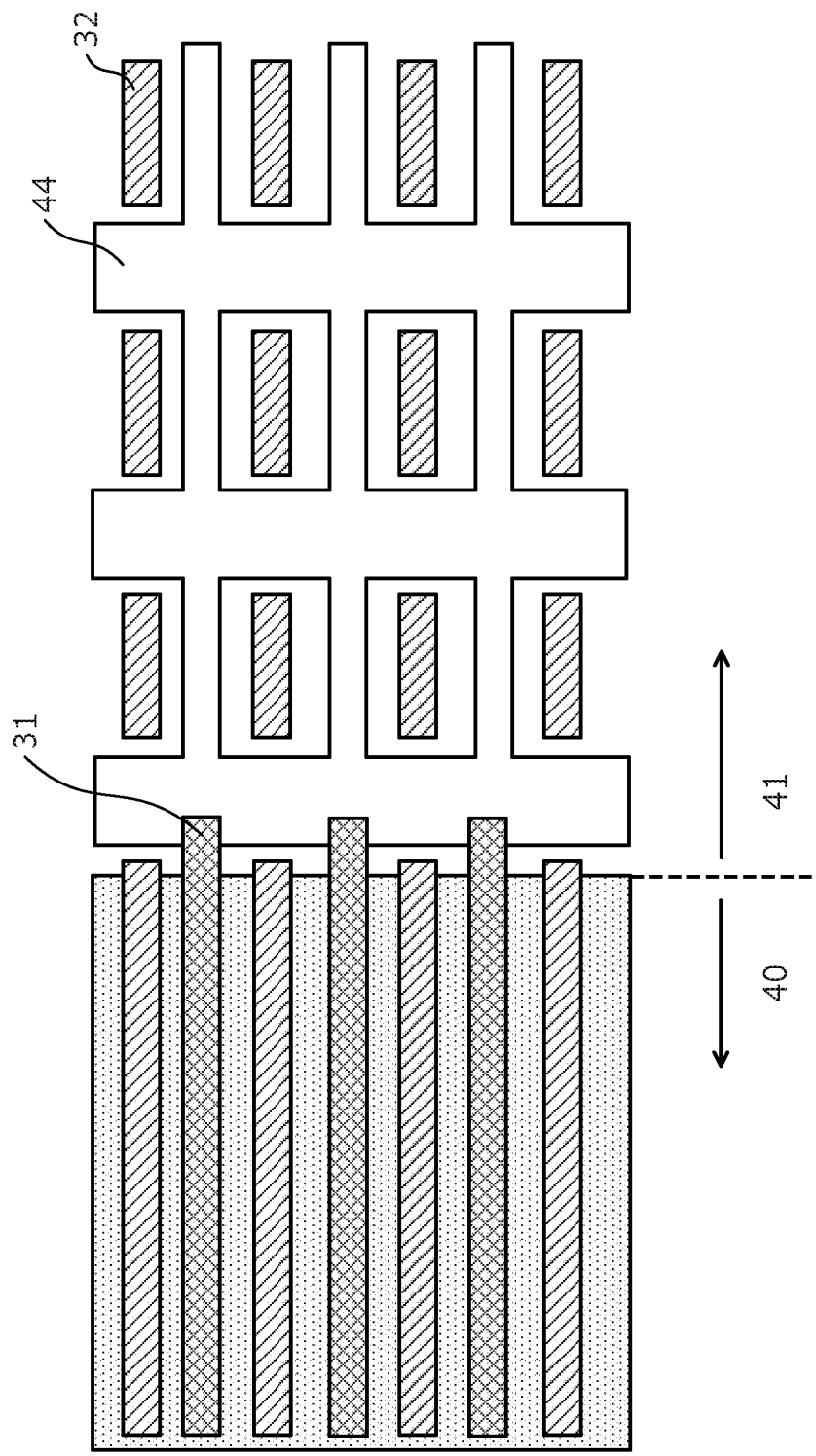
FIG. 8 is a top view depicting another structure of the silicon carbide semiconductor device according to the first embodiment.

FIG. 8 is a top view depicting another structure of the silicon carbide semiconductor device according to the first embodiment. In FIG. 8, only portions of the active region 40 and the connecting region 41 are depicted. As depicted in FIG. 8, the trench SBDs 32 of the connecting region 41 may be divided into multiple short portions. In this instance, the polysilicon 44 is disposed between the portions of the trench SBDs 32.

Figure 9:
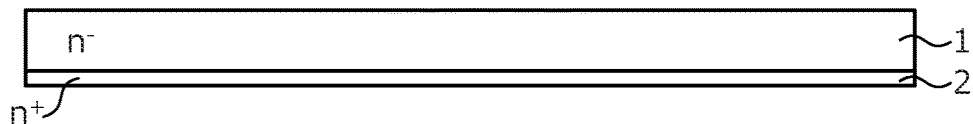
FIG. 9 is a cross-sectional view depicting a state of the silicon carbide semiconductor device according to the first embodiment during manufacture.

Next, a method of manufacturing the semiconductor device according to the first embodiment is described. FIGS. 9, 10, 11, 12, and 13 are cross-sectional views depicting states of the silicon carbide semiconductor device according to the first embodiment during manufacture. First, the $n^+$-type silicon carbide substrate 2, which constitutes the $n^+$-type drain region, is prepared. Next, on the front surface of the $n^+$-type silicon carbide substrate 2, the $n^-$-type drift layer 1 described above is epitaxially grown. For example, conditions of the epitaxial growth for forming the $n^-$-type drift layer 1 may be set so that the impurity concentration of the $n^-$-type drift layer 1 becomes about $3\times10^{15}/cm^3$. The state up to here is depicted in FIG. 9.

Figure 10:
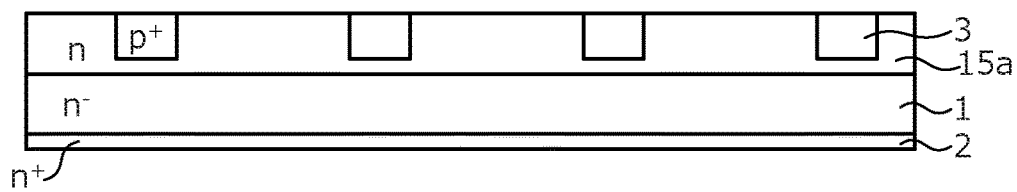
FIG. 10 is a cross-sectional view depicting a state of the silicon carbide semiconductor device according to the first embodiment during manufacture.

Next, on the $n^-$-type drift layer 1, a lower n-type region 15a (in an instance in which the n-type region 15 is omitted, an n-type layer having an impurity concentration that is about the same as the impurity concentration of the $n^-$-type drift layer 1, hereinafter, simply "n-type layer") is epitaxially grown. For example, conditions of the epitaxial growth for forming the lower n-type region 15a may be set so that the impurity concentration of the lower n-type region 15a becomes about $1\times10^{17}/cm^3$. The lower n-type region 15a is a portion of the n-type region 15. Next, in the lower n-type region 15a (n-type layer), at the surface thereof, the first $p^+$-type regions 3 are selectively formed by photolithography and ion implantation of a p-type impurity. For example, a dose amount during the ion implantation for forming the first $p^+$-type regions 3 may be set so that the impurity concentration becomes about $5\times10^{18}/cm^3$. Similarly, the first $p^+$-type regions 3 are selectively formed in the connecting region 41 and the edge region 42 as well. The state up to here is depicted in FIG. 10.

Figure 11:
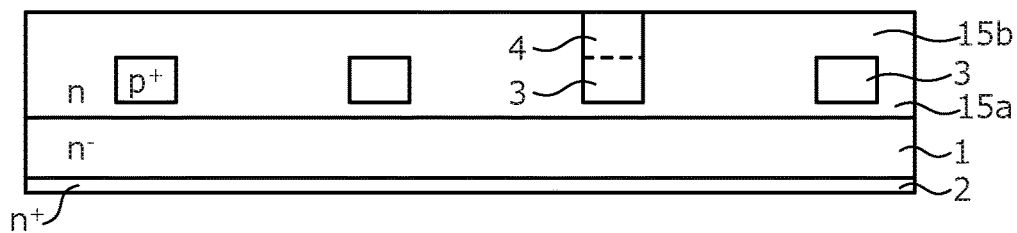
FIG. 11 is a cross-sectional view depicting a state of the silicon carbide semiconductor device according to the first embodiment during manufacture.

Next, an upper n-type region 15b (n-type layer) is epitaxially grown on the lower n-type region 15a (n-type layer) and the first $p^+$-type regions 3. For example, conditions of the epitaxial growth for forming the upper n-type region 15b may be set so that the impurity concentration becomes about the same as that of the lower n-type region 15a. The upper n-type region 15b is a portion of the n-type region 15 and the lower n-type region 15a and the upper n-type region 15b combined constitute the n-type region 15. Next, in the upper n-type region 15b (n-type layer), at the surface thereof, the second $p^+$-type regions 4 are selectively formed by photolithography and ion implantation of a p-type impurity. For example, a dose amount during the ion implantation for forming the second $p^+$-type regions 4 may be set so that the impurity concentration becomes about the same as that of the first $p^+$-type regions 3. Each region that is a combination of one of the first $p^+$-type regions 3 and one of the second $p^+$-type regions 4 is indicated as "first, second $p^+$-type region 3, 4". Similarly, the second $p^+$-type regions 4 are selectively formed in the connecting region 41 and the edge region 42 as well. When the second $p^+$-type regions 4 are formed, in the connecting region 41, formation is such that sidewalls of the trench SBDs 32 are not in contact with the second $p^+$-type regions 4. The state up to here is depicted in FIG. 11.

Next, the p-type base layer 16 is epitaxially grown on the upper n-type region 15b and the second p$^+$-type regions 4. For example, conditions of the epitaxial growth for forming the p-type base layer 16 may be set so that the impurity concentration of the p-type base layer 16 becomes about $4\times10^{17}/cm^3$.

Next, in the p-type base layer 16, at the surface thereof, the n$^+$-type source regions 17 are selectively formed by photolithography and ion implantation of an n-type impurity. For example, a dose amount during the ion implantation for forming the n$^+$-type source regions 17 may be set so that the impurity concentration thereof becomes about $3\times10^{20}/cm^3$.

Figure 12:
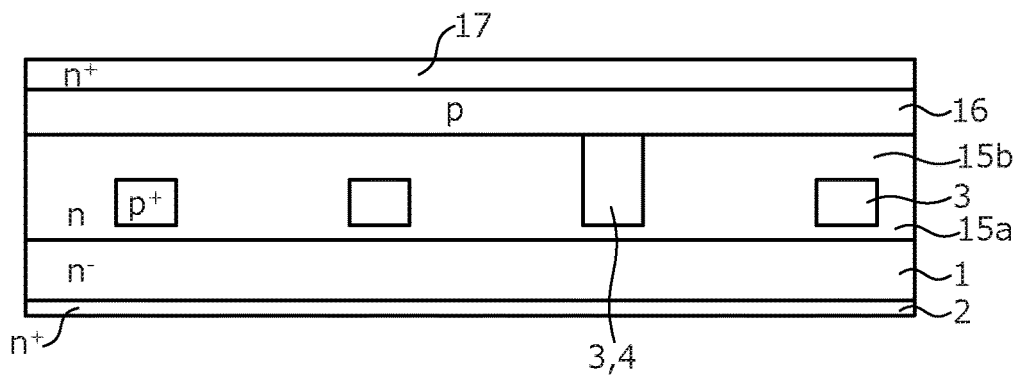
FIG. 12 is a cross-sectional view depicting a state of the silicon carbide semiconductor device according to the first embodiment during manufacture.

Next, in the p-type base layer 16, at the surface thereof, the p$^{++}$-type contact regions 18 may be selectively formed by photolithography and ion implantation of a p-type impurity so as to be in contact with the n$^+$-type source regions 17. For example, a dose amount during the ion implantation for forming the p$^{++}$-type contact regions 18 may be set so that the impurity concentration thereof becomes about $3\times10^{20}/cm^3$. A sequence in which the n$^+$-type source regions 17 and the p$^{++}$-type contact regions 18 are formed may be interchanged. Next, by photolithography and ion implantation of a p-type impurity, a JTE region 43 is formed in the edge region 42. After all ion implantations are completed, activation annealing is implemented. The state up to here is depicted in FIG. 12.

Next, by photolithography and etching, the trench gates 31 that penetrate through the n$^+$-type source regions 17 and the p-type base layer 16 and reach the n-type region 15 (1) are formed. Bottoms of the trench gates 31 may reach the first p$^+$-type regions 3 or may be positioned in the n-type region 15 (1), sandwiched between the p-type base layer 16 and the first p$^+$-type regions 3. Subsequently, a mask for forming the trench gates 31 is removed. Further, an oxide film is used as a mask during trench formation. Further, after the trench etching, isotropic etching for removing damage of the trench gates 31 and hydrogen annealing for rounding the bottoms of the trench gates 31 and corners of openings of the trench gates 31 may be implemented. Either the isotropic etching or the hydrogen annealing alone may be performed. Further, the hydrogen annealing may be performed after the isotropic etching.

Figure 13:
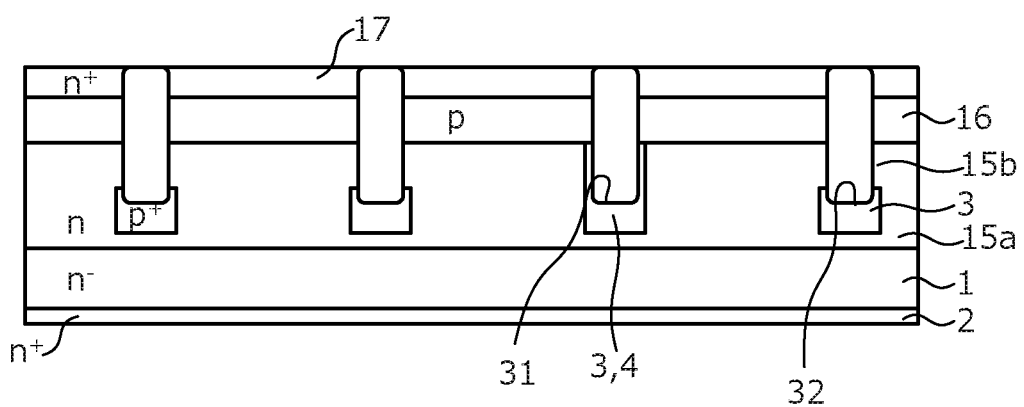
FIG. 13 is a cross-sectional view depicting a state of the silicon carbide semiconductor device according to the first embodiment during manufacture.

Next, by photolithography and etching, the trench SBDs 32 that penetrate through the n$^+$-type source regions 17 and the p-type base layer 16 and reach the n-type region 15 (1) are formed. The bottoms of the trench SBDs 32 may reach the first p$^+$-type regions 3 or may be positioned in the n-type region 15 (1), sandwiched between the p-type base layer 16 and the first p$^+$-type regions 3. Subsequently, a mask for forming the trench SBDs 32 is removed. At this time, the trench SBDs 32 may be further formed in the connecting region 41. The state up to here is depicted in FIG. 13.

Next, the gate insulating films 19 are formed along the front surface of the silicon carbide wafer and the inner walls of the trench gates 31. Next, for example, a polysilicon is deposited so as to be embedded in the trench gates 31 and is etched, whereby portions of the polysilicon constituting the gate electrodes 20 are left in the trench gates 31. At this time, etching may be performed so that the polysilicon is below the wafer surface or the polysilicon may be patterned and etched so as to protrude outwardly beyond the wafer surface.

Next, the interlayer insulating film 21 is formed in an entire area of the front surface of the silicon carbide wafer, so as to cover the gate electrodes 20. The interlayer insulating film 21 is formed by, for example, a none-doped silicate glass (NSG), a phosphosilicate glass (PSG), a borophosphosilicate glass (BPSG), a high temperature oxide (HTO), or a combination thereof. Next, the interlayer insulating film 21 and the gate insulating films 19 are patterned and contact holes are formed, whereby the n$^+$-type source regions 17 are exposed. In an instance in which the p$^{++}$-type contact regions 18 are formed, the n$^+$-type source regions 17 and the p$^{++}$-type contact regions 18 are exposed.

Next, the barrier metal is formed so as to cover the interlayer insulating film 21 and is patterned, thereby again exposing the n$^+$-type source regions 17 and the p$^{++}$-type contact regions 18. Next, the source electrode 22 is formed so as to be in contact with the n$^+$-type source regions 17. The source electrode 22 may be formed so as to cover the barrier metal or may be formed only in the contact holes.

Next, a metal film of, for example, titanium (Ti) is formed along the inner walls of the trench SBDs 32. Next, for example, a heat treatment (annealing) under a nitrogen (N$_2$) atmosphere of a temperature of 500 degrees C. or less is performed, whereby a Schottky junction between the metal film at the inner walls of the trench SBDs 32 and the semiconductor region is formed.

Next, the source electrode pad is formed so as to be embedded in the contact holes. A portion of a metal layer deposited to form the source electrode pad may constitute the gate electrode pad. At the back surface of the n$^+$-type silicon carbide substrate 2, a metal film such as a nickel (Ni) film, a titanium (Ti) film, etc. is formed on a contact portion of the drain electrode, using, for example, sputtering deposition. The metal film may be a combination of stacked Ni films and Ti films. Thereafter, annealing such as a rapid heat treatment (rapid thermal annealing (RTA)) is implemented so that the metal film is converted into a silicide and an ohmic contact is formed. Thereafter, for example, a thick film such as a layered film in which a Ti film, a Ni film, and a gold (Au) film are sequentially stacked is formed by electron beam (EB) deposition, whereby the drain electrode is formed.

In the epitaxial growth and ion implantation described above, as an n-type impurity (n-type dopant), for example, nitrogen (N) or phosphorus (P), arsenic (As), antimony (Sb), etc. may be used as an n-type with respect to silicon carbide. As a p-type impurity (p-type dopant), for example, boron (B), aluminum (Al), gallium (Ga), indium (In), thallium (Tl), etc. may be used as a p-type impurity with respect to silicon carbide. In this manner, the MOSFET depicted in FIGS. 1 to 6 is completed.

As described above, according to the first embodiment, the trench SBDs are disposed in the connecting region. As a result, in the connecting region, the trench SBDs may be caused to function as parasitic Schottky diodes. Therefore, when negative bias is applied to the drain side of the silicon carbide semiconductor device having built-in SBDs, parasitic Schottky diodes operate in the connecting region as well, whereby bipolar operation of the parasitic pn diodes may be suppressed and forward degradation and increases in turn-on loss may be suppressed.

Figure 14:
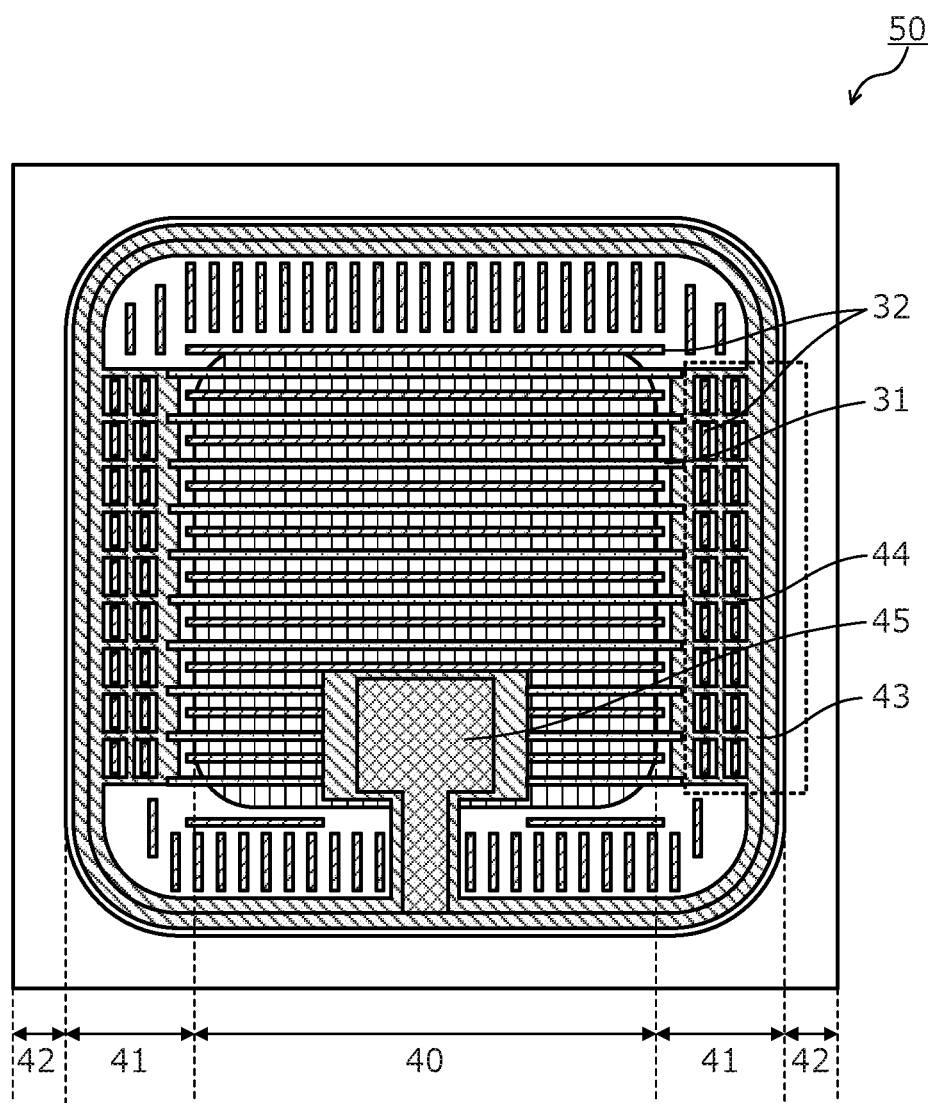
FIG. 14 is a top view depicting a structure of a silicon carbide semiconductor device according to a second embodiment.

Next, a second embodiment is described. FIG. 14 is a top view depicting a structure of a silicon carbide semiconductor device according to the second embodiment. The silicon carbide semiconductor device according to the second embodiment differs from the silicon carbide semiconductor device according to the first embodiment in that a longitudinal direction of the trench SBDs 32 provided in the connecting region 41 is disposed in a direction orthogonal to the longitudinal direction of the trench SBDs 32 disposed in the active region 40.

Further, an interval between the trench SBDs 32 disposed in the connecting region 41 may be a same as an interval between the trench SBDs 32 disposed in the active region 40, or may be wider. In the second embodiment as well, an effect of suppressing parasitic pn diode operation in the connecting region 41 by the trench SBDs 32 is obtained, similarly to the active region 40. Thus, in the second embodiment, in the overall chip, degradation of characteristics due to forward conduction may be suppressed.

Further, when the trench SBDs 32 disposed in the longitudinal direction of the trench gates 31 are long, the polysilicon 44 and the trench gates 31 cannot be connected and thus, the length of the trench SBDs 32 may be preferably shorter than the interval between the trench gates 31.

On the other hand, while the trench SBDs 32, which are disposed in the direction orthogonal to the longitudinal direction of the trench gates 31, may be long as depicted in FIG. 14, the trench SBDs 32 may be divided into multiple portions to have short lengths. In this instance, the polysilicon 44 is disposed between the portions of the trench SBDs 32.

Figure 15:
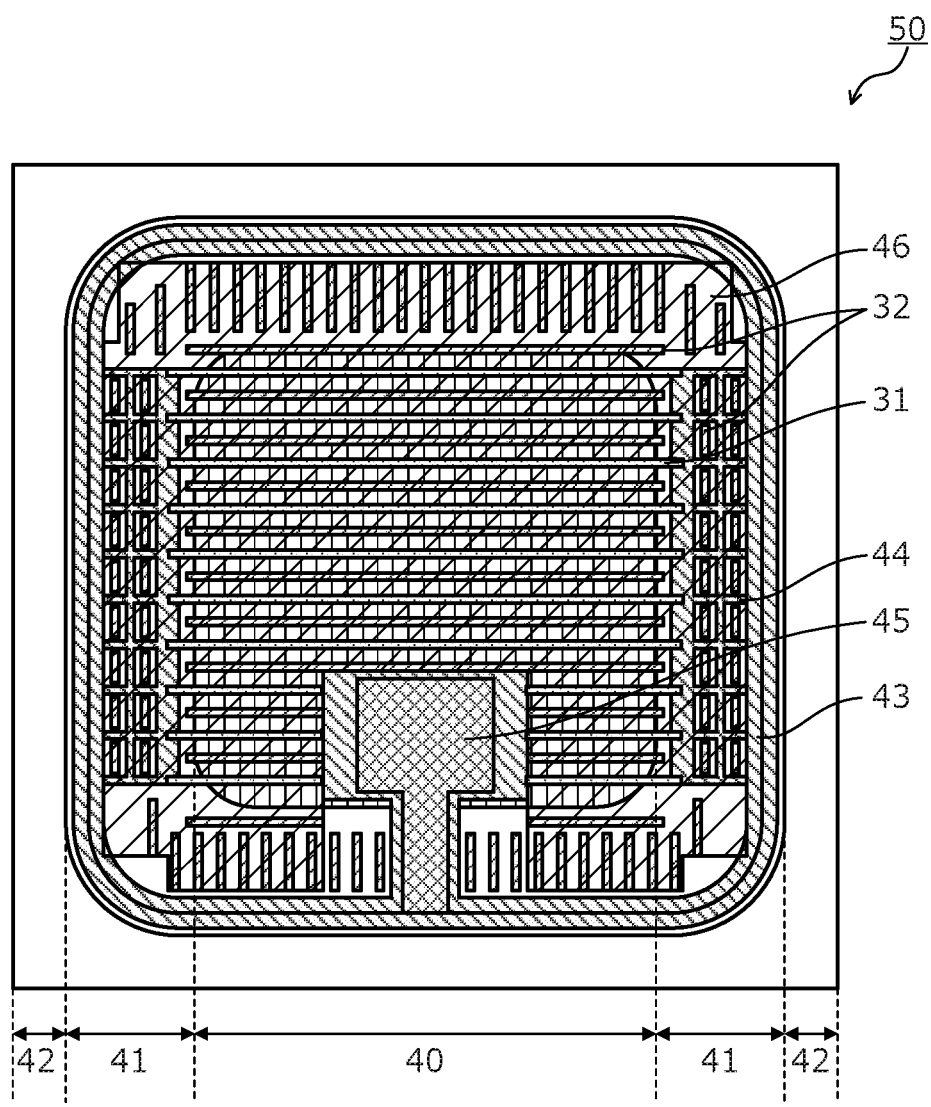
FIG. 15 is a top view of the source electrode pad of the silicon carbide semiconductor device according to the second embodiment.
Figure 16:
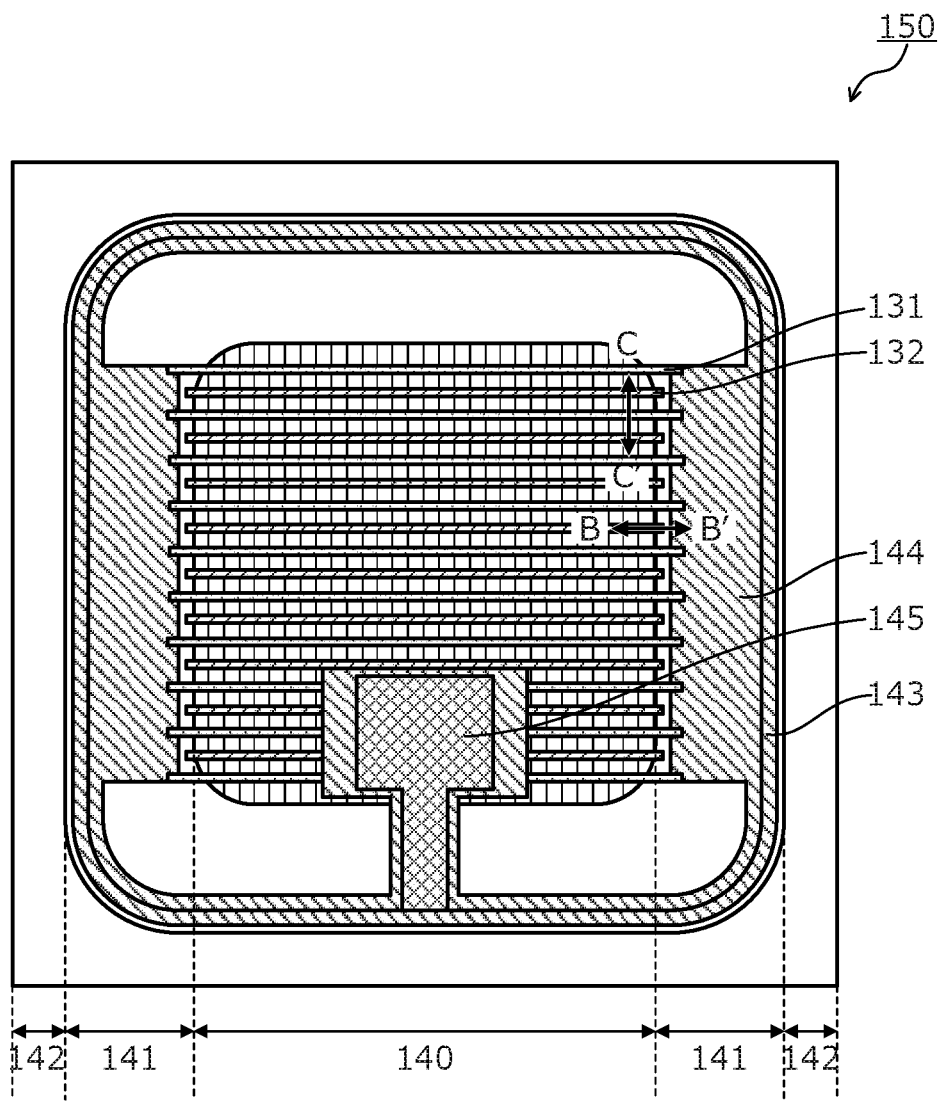
FIG. 16 is a top view of a structure of a conventional silicon carbide semiconductor device with a built-in SBD.
Figure 17:
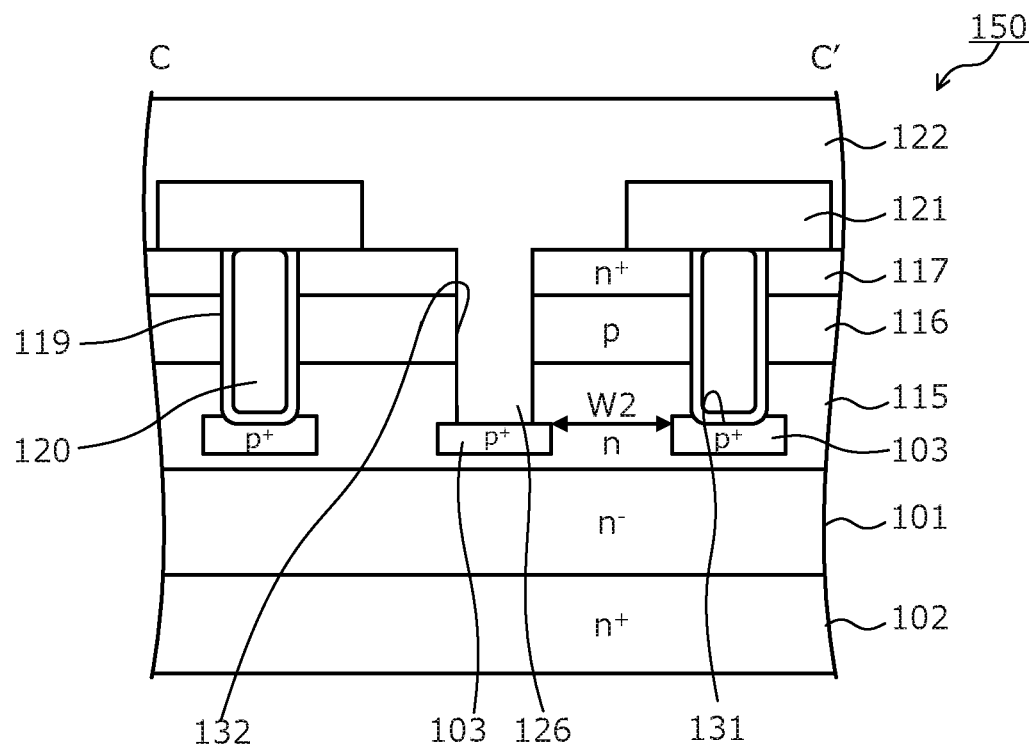
FIG. 17 is a cross-sectional view of a portion of the conventional silicon carbide semiconductor device, along cutting line C-C' in FIG. 16.

FIG. 15 is a top view of the source electrode pad of the silicon carbide semiconductor device according to the second embodiment. In the second embodiment as well, similarly to the first embodiment, the source electrode pad 46 is provided on the active region 40 and the connecting region 41 in which the trench SBDs 32 are disposed.

A method of manufacturing the semiconductor device according to the second embodiment may be implemented by changing the longitudinal direction of the trench SBDs 32 that are disposed in the connecting region 41, in the method of manufacturing the semiconductor device according to the first embodiment. Therefore, detailed description of the method of manufacturing the semiconductor device according to the second embodiment is omitted.

As described, according to the second embodiment, the trench SBDs 32 are disposed in the connecting region 41. As a result, effects similar to those of the first embodiment are obtained.

In the foregoing, the present invention may be variously modified within a range not departing from the spirit of the invention and in the described embodiments, for example, dimensions, impurity concentrations, etc. may be variously set according to necessary specifications. Further, in the described embodiments, while a MOSFET is described as an example, without limitation hereto, wide application is possible to various types of silicon carbide semiconductor devices that conduct and block current under gate-driving control based on a predetermined threshold voltage. A silicon carbide semiconductor device under gate-driving control is, for example, an insulated gate bipolar transistor (IGBT) or the like. Further, in the described embodiments, while, as an example, an instance is described in which silicon carbide is used as a wide band gap semiconductor, in addition to silicon carbide, for example, a wide band gap semiconductor such as gallium nitride (GaN) is applicable. Further, in the embodiments, while the first conductivity type is an n-type and the second conductivity type is a p-type, the present invention is similarly implemented when the first conductivity type is a p-type and the second conductivity type is an n-type.

According to the described invention, the trench SBDs are disposed in the connecting region. As a result, in the connecting region as well, the trench SBDs may be caused to function as parasitic Schottky diodes. Therefore, when negative bias is applied to the drain side of the silicon carbide semiconductor device having built-in SBDs, parasitic Schottky diodes operate in the connecting region as well, whereby bipolar operation of the parasitic pn diodes may be suppressed and forward degradation and increases in turn-on loss may be suppressed. The SBDs are formed by trenches, whereby the distance between the Schottky junction and the parasitic pn diode may be shortened, thereby enabling more effective suppression of the operation of the parasitic pn diodes. Further, reverse recovery loss during switching operation of the MOSFET may be reduced.

The semiconductor device according to the present invention achieves an effect in that reverse recovery loss, degradation of forward voltage, and turn-on loss may be reduced.

As described, the semiconductor device according to the present invention is useful for power semiconductor devices used in power converting equipment, power source devices of various types of industrial machines, etc., and is particularly suitable for silicon carbide semiconductor devices having a trench gate structure.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor device having
an active region through which current flows in an on state of the semiconductor device,
an edge region surrounding a periphery of the active region in a top view of the semiconductor device, and sustaining a breakdown voltage, and
a connecting region that is between the active region and the edge region,
the semiconductor device comprising:
a semiconductor substrate of a first conductivity type, the semiconductor substrate having a main surface;
a first semiconductor layer of the first conductivity type, provided on the main surface of the semiconductor substrate, the first semiconductor layer having an impurity concentration that is lower than an impurity concentration of the semiconductor substrate, the first semiconductor layer having a first surface and a second surface that are opposite to each other, the second surface facing the semiconductor substrate;
a second semiconductor layer of a second conductivity type, provided on the first surface of first semiconductor layer;
a plurality of first semiconductor regions of the first conductivity type, selectively provided in the second semiconductor layer and having an impurity concentration that is higher than the impurity concentration of the semiconductor substrate;
a plurality of first trenches and a plurality of second trenches that penetrate through the plurality of first semiconductor regions and the second semiconductor layer and reach the first semiconductor layer;
a plurality of gate electrodes provided in the plurality of first trenches, via a plurality of gate insulating films, respectively; and
a plurality of Schottky electrodes provided in the plurality of second trenches, respectively, wherein
the semiconductor substrate, the first semiconductor layer, the second semiconductor layer, the plurality of first semiconductor regions, the plurality of first trenches, the plurality of gate electrodes, and the plurality of gate insulating films are provided in the active region, and the plurality of second trenches and the plurality of Schottky electrodes are provided in both the active region and the connecting region.

2. The semiconductor device according to claim 1, wherein
a longitudinal direction of the plurality of second trenches provided in the connecting region is parallel to a longitudinal direction of the plurality of second trenches provided in the active region.

3. The semiconductor device according to claim 1, wherein
a longitudinal direction of the plurality of second trenches provided in the connecting region is orthogonal to a longitudinal direction of the plurality of second trenches provided in the active region.

4. The semiconductor device according to claim 1, wherein
an interval between any adjacent two of the plurality of second trenches provided in the connecting region is at least equal to an interval between any adjacent two of the plurality of second trenches provided in the active region.

5. The semiconductor device according to claim 1, wherein
each of the plurality of second trenches provided in the connecting region is divided into a plurality of portions, which is provided in a longitudinal direction of the plurality of second trenches provided in the active region.

* * * * *